United States Patent [19]

Köhl

[11] 4,239,585
[45] Dec. 16, 1980

[54] PROCESS FOR THE PRODUCTION OF HIGH PURITY SILICON MONOCRYSTALS HAVING A LOW OXYGEN CONTENT

[75] Inventor: Franz Köhl, Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 954,518

[22] Filed: Oct. 25, 1978

[30] Foreign Application Priority Data

Dec. 30, 1977 [DE] Fed. Rep. of Germany ....... 2758888

[51] Int. Cl.³ .............................................. C30B 15/00
[52] U.S. Cl. ....................... 156/617 SP; 156/DIG. 64
[58] Field of Search .......... 156/DIG. 64, 618, 617 SP

[56] References Cited

U.S. PATENT DOCUMENTS

| 3,275,417 | 9/1966 | Hunt | 156/DIG. 64 |
|---|---|---|---|
| 3,929,557 | 12/1975 | Goodrum | 156/618 |
| 4,040,895 | 8/1977 | Patrick | 156/618 |

FOREIGN PATENT DOCUMENTS

| 2639707 | 10/1975 | Fed. Rep. of Germany . | |
|---|---|---|---|
| 2619965 | 12/1976 | Fed. Rep. of Germany . | |
| 797377 | 7/1958 | United Kingdom | 156/DIG. 64 |

OTHER PUBLICATIONS

Scheel, IBM Tech. Discl. Bulle., vol. 14, #5, Oct. 1971, p. 1631.

*Primary Examiner*—Hiram H. Bernstein
*Attorney, Agent, or Firm*—Allison C. Collard; Thomas M. Galgano

[57] ABSTRACT

The invention provides a process according to which the oxygen content in crucible-drawn silicon crystals can be lowered and kept substantially constant throughout the length of the rod. This is achieved in that, after applying the seed crystal to the melt pool, the silicon rod being drawn from the melt pool is initially rotated at a speed from 3 to 6 rev/min and this rotational speed is preferably increased to higher values during the drawing process.

3 Claims, No Drawings

PROCESS FOR THE PRODUCTION OF HIGH PURITY SILICON MONOCRYSTALS HAVING A LOW OXYGEN CONTENT

The invention relates to a process for the production of high purity silicon monocrystals having a low oxygen content, according to the Czochralski crucible-drawing process.

According to the known Czochralski crucible-drawing process, pieces of polycrystalline silicon are melted in a quartz crucible by inductive heating or, alternatively, by suitable resistance heating. A seed crystal is then dipped into this melt and is continuously drawn from the melt while being slowly rotated. The diameter of the silicon rod so obtained depends on the drawing speed and on the temperature of the melt. Typical values for the drawing speed in the production of silicon rods having diameters of approximately 75 mm are 1 to 3 mm/min., at rotational speeds of the crystalline rods, being drawn from the melt, of from approximately 10 to 20 rev/min, about the longitudinal axis.

The most important impurity in such crucible-drawn silicon monocrystals is oxygen, the content of which at the beginning of the rod is typically approximately $12 \times 10^{17}$ and at the end of the rod approximately $5 \times 10^{17}$ atoms/cm$^3$. This oxygen content results from the decomposition of the quartz crucible by the molten silicon, which proceeds according to the equation $$Si + SiO_2 \rightleftharpoons 2\ SiO.$$

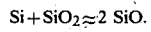

This high oxygen content in the silicon has a significant influence on the electrical properties of semiconductor components manufactured therefrom, especially when the oxygen concentration is approximately the same as or up to 3 orders of magnitude greater than the concentration of the dopants. This is generally the case with crucible-drawn silicon, in contrast to zone-drawn silicon.

If the concentration of the oxygen is higher than its solubility in solid silicon at a certain temperature, then, at higher temperatures, precipitation occurs which leads to crystal defects such as, for example, swirls or stacking faults. After oxidizing such a silicon disc, an increase in the etch defects is observed with increasing interstitially-incorporated oxygen. Stacking faults of this kind, however, increase the dark current in charge-coupled devices or the leakage current in transistors. When processing a silicon disc, the lower the amount of silicon dioxide precipitation, the less warpage will occur. The life of the minority carriers, as well as the diffusion conditions when doping, are also dependent on the crystal faults and thus also on the oxygen content of the silicon disc. In order to avoid precipitation in those temperature processes to which the silicon disc is subjected in the manufacture of electronic devices, the oxygen content in the basic material should therefore be sufficiently low that no precipitation occurs.

The oxygen content in the silicon crystal should not only be low, but should also be approximately uniform throughout the length of the rod, so that after sawing the rod into individual silicon discs it is possible to ensure that the component specifications for all the discs are uniform.

In accordance with German Offenlequngsschrift 26 39 707, during crucible-drawing, the rotation of the crucible is periodically arrested to produce a shear at the parting plane between the melt and the crucible. As a result of the large relative movement so produced between the crucible and the melt, a more rapid removal of the resulting silicon oxide gas is ensured and consequently the reaction between the melt and the crucible is promoted. As a result, although silicon rods having a substantially uniform oxygen content throughout the length of the rod are obtained, the oxygen content is exceptionally high and even lies above the values typical for the customary Czochralski crucible-drawing process.

Finally, a process for the controlled adjustment of the oxygen concentration in silicon crystals is known from German Offenlegungsschrift No. 26 19 965, according to which the silicon crucible is subjected to pre-treatment which consists, for example, of the surface of the crucible internal wall being roughened, for example, by sand blasting. By this process, the oxygen content in the silicon rod drawn from such a crucible is not lowered, however, but rather is further increased.

The underlying problem of the invention was therefore to modify the customary Czochralski crucible-drawing process to such an extent that it is possible to produce silicon rods having a comparatively low oxygen content.

This problem is solved in that, after applying the seed crystal to the melt pool, the silicon rod is drawn out of the melt at a rotational speed of from 3 to 6 rev/min. According to a preferred embodiment, during the drawing process, the silicon rod is rotated about its axis at an increasing speed and this is preferably carried out by increasing the rotational speed by 0.5 to 2 rev/min per 10 cm of crystallized silicon rod. The rotation of the growing silicon rod may be increased periodically or continuously, preference generally being given to a computer-controlled continuous operation. The increase in the rotational speed of the silicon rod does not have to be linear from the beginning of the rod to the end of the rod but may, in individual cases, take place more slowly or more quickly towards the end of the rod. In accordance with the preferred embodiment, when drawing a silicon rod of approximately 1 mm in length, the rotational speed is thus 3 to 6 rev/min at the beginning of the rod and 8 to 26 rev/min at the end of the rod.

EXAMPLE 1

In a crucible-drawing apparatus customary for the production of rod-shaped silicon monocrystals according to the Czochralski method, 11 kg of silicon were placed in the quartz crucible and melted under vacuum pressure conditions. The lower end of a seed crystal was then dipped into the melt in known manner and drawn upward at a speed of approximately 3 mm/min and with an initial rotational speed of 3 rev/min. After 15 cm of the rod had been drawn, the rotational speed was increased to 4 rev/min, after 30 cm to 5 rev/min and after 50 cm to 8 rev/min, and the last mentioned speed was maintained until the end of the rod at 80 cm. The oxygen content of the rod was then determined using an infrared absorption spectroscope (ASTM F 121-70 T "Test for interstitial atomic oxygen content of silicon by infrared absorption"). The results are given in the following table.

| Distance from the seed crystal in cm | 1 | 16 | 31 | 54 | 63 | 76 |
|---|---|---|---|---|---|---|
| Oxygen content in atoms/cm$^3$ × 10$^{17}$ | 7.5 | 6.9 | 6.5 | 6.2 | 6.0 | 5.48 |

EXAMPLE 2

The procedure was exactly the same as in Example 1, except that the rotational speed of the growing 3 inch silicon rod was increased continuously and at a uniform rate from 3 rev/min at the beginning, to 10 rev/min at the end of the rod. The oxygen content determined is given in the table below:

| Distance from the seed crystal in cm | 2 | 17 | 32 | 52 | 67 | 80 |
|---|---|---|---|---|---|---|
| Oxygen content in atoms/cm$^3$ × 10$^{17}$ | 7.7 | 7.1 | 6.8 | 6.5 | 6.4 | 6.5 |

EXAMPLE 3

The procedure was exactly the same as in Example 1, except that the silicon rod growing out of the melt was drawn out of the melt from beginning to end at a rotational speed of 5 rev/min. The following oxygen content resulted:

| Distance from the seed crystal in cm | 2 | 17 | 32 | 52 | 64 | 79 |
|---|---|---|---|---|---|---|
| Oxygen content in atoms/cm$^3$ × 10$^{17}$ | 8.8 | 7.8 | 7.2 | 6.5 | 5.7 | 4.8 |

EXAMPLE 4

The procedure was exactly the same as in Example 1, except that, for comparison, the silicon rod growing out of the melt was rotated uniformly at a speed of 15 rev/min during the whole drawing process, in accordance with the customary Czochralski crucible-drawing process. The oxygen content determined was as follows:

| Distance from the seed crystal in cm | 1 | 50 | 80 |
|---|---|---|---|
| Oxygen content in atoms/cm$^3$ × 10$^{17}$ | 12.5 | 7.8 | 5.8 |

By comparing Examples 1 to 3 according to the invention with the customary procedure according to Example 4, it can be seen that, according to the invention, it is not only possible to reduce the oxygen content by an appreciable amount, but it is also possible to keep the oxygen content substantially constant over the whole length of the rod. Example 3 especially shows that the process according to the invention makes it possible greatly to reduce the oxygen content at the beginning of the rod and thus to produce swirl-free silicon.

While only several embodiments of the present invention have been described, it will be obvious to those persons of ordinary skill in the art, that many changes and modifications may be made thereunto without departing from the spirit and scope of the invention.

What is claimed is:

1. An improved process for the production of high purity silicon monocrystals having a low oxygen content of the Czochralski crucible-drawing type wherein polycrystalline silicon is melted in a crucible to produce a melt and a seed crystal is then dipped into the melt and is continuously drawn therefrom while being rotated so as to produce a growing monocrystalline silicon rod, which is withdrawn from the melt, the improvement comprising:
   initially withdrawing the crystallized silicon rod from the melt while rotating said rod at a speed within the range of from 3 to 6 rev/min and increasing the rotational speed by 0.5 to 2 rev/min per 10 cm of crystallized silicon rod.

2. The process according to claim 1, wherein said speed of rotation of said silicon rod is increased continuously.

3. The process according to claim 1, wherein said speed or rotation of said silicon rod is increased continuously at a uniform rate.

* * * * *